(12) United States Patent
Sumant et al.

(10) Patent No.: US 10,410,860 B2
(45) Date of Patent: Sep. 10, 2019

(54) TRANSPARENT NANOCRYSTALLINE DIAMOND COATINGS AND DEVICES

(71) Applicant: UCHICAGO ARGONNE, LLC, Chicago, IL (US)

(72) Inventors: Anirudha V. Sumant, Plainfield, IL (US); Adam Khan, San Francisco, CA (US)

(73) Assignee: UChicago Argonne, LLC, Chicago, IL (US)

( * ) Notice: Subject to any disclaimer, the term of this patent is extended or adjusted under 35 U.S.C. 154(b) by 4 days.

(21) Appl. No.: 15/676,895

(22) Filed: Aug. 14, 2017

(65) Prior Publication Data
US 2017/0372896 A1    Dec. 28, 2017

Related U.S. Application Data

(62) Division of application No. 14/796,527, filed on Jul. 10, 2015, now Pat. No. 9,741,561.

(51) Int. Cl.
| | | |
|---|---|---|
| *H01L 21/00* | (2006.01) | |
| *H01L 21/02* | (2006.01) | |
| *C23C 16/511* | (2006.01) | |
| *C23C 16/27* | (2006.01) | |
| *H01L 29/16* | (2006.01) | |
| *H01L 29/04* | (2006.01) | |
| *C23C 16/56* | (2006.01) | |

(Continued)

(52) U.S. Cl.
CPC ...... *H01L 21/02527* (2013.01); *C23C 16/274* (2013.01); *C23C 16/511* (2013.01); *C23C 16/56* (2013.01); *H01L 21/0262* (2013.01); *H01L 21/02576* (2013.01); *H01L 21/02579* (2013.01); *H01L 23/3732* (2013.01); *H01L 29/04* (2013.01); *H01L 29/1602* (2013.01); *H01L 29/861* (2013.01)

(58) Field of Classification Search
None
See application file for complete search history.

(56) References Cited

U.S. PATENT DOCUMENTS

| | | |
|---|---|---|
| 5,001,452 A | 3/1991 | Imai et al. |
| 5,183,530 A | 2/1993 | Yamazaki |
| 5,436,505 A | 7/1995 | Hayashi et al. |

(Continued)

OTHER PUBLICATIONS

Abdel-Motaleb, Ibrahim M., Diamond Technology: An Overview, IEEE, Oct. 2006, 4 pages.

(Continued)

*Primary Examiner* — Hung K Vu
(74) *Attorney, Agent, or Firm* — Foley & Lardner LLP

(57) ABSTRACT

A method for coating a substrate comprises producing a plasma ball using a microwave plasma source in the presence of a mixture of gases. The plasma ball has a diameter. The plasma ball is disposed at a first distance from the substrate and the substrate is maintained at a first temperature. The plasma ball is maintained at the first distance from the substrate, and a diamond coating is deposited on the substrate. The diamond coating has a thickness. Furthermore, the diamond coating has an optical transparency of greater than about 80%. The diamond coating can include nanocrystalline diamond. The microwave plasma source can have a frequency of about 915 MHz.

9 Claims, 14 Drawing Sheets

(51) Int. Cl.
*H01L 23/373* (2006.01)
*H01L 29/861* (2006.01)

(56) References Cited

U.S. PATENT DOCUMENTS

| | | | |
|---|---|---|---|
| 5,622,902 | A | 4/1997 | Kurtz et al. |
| 5,717,214 | A | 2/1998 | Kitamura et al. |
| 6,340,393 | B1 | 1/2002 | Yoshida |
| 7,556,982 | B2 | 7/2009 | Carlisle et al. |
| 7,781,257 | B2 | 8/2010 | Taylor |
| 8,354,290 | B2 | 1/2013 | Sumant et al. |
| 8,420,043 | B2 | 4/2013 | Gamo et al. |
| 9,108,888 | B2 | 8/2015 | Neogi et al. |
| 9,741,561 | B2 * | 8/2017 | Sumant ............. H01L 21/02527 |
| 2002/0041154 | A1 | 4/2002 | Tomasetti et al. |
| 2003/0001498 | A1 | 1/2003 | Niigaki et al. |
| 2004/0129202 | A1 | 7/2004 | Gruen et al. |
| 2004/0221795 | A1 | 11/2004 | Scarsbrook et al. |
| 2006/0060864 | A1 | 3/2006 | Gerbi |
| 2006/0131588 | A1 | 6/2006 | Gruen et al. |
| 2007/0057261 | A1 | 3/2007 | Jeong et al. |
| 2007/0220959 | A1 | 9/2007 | Sumant et al. |
| 2008/0134960 | A1 | 6/2008 | Kasu et al. |
| 2009/0124025 | A1 | 5/2009 | Hamilton et al. |
| 2009/0239078 | A1 | 9/2009 | Asmussen et al. |
| 2010/0051964 | A1 | 3/2010 | Lin et al. |
| 2010/0052112 | A1 | 3/2010 | Rogers et al. |
| 2010/0084634 | A1 | 4/2010 | Gamo et al. |
| 2010/0189924 | A1 * | 7/2010 | D'Evelyn ............. C23C 16/274 427/575 |
| 2011/0095267 | A1 | 4/2011 | Bryant et al. |
| 2012/0312353 | A1 | 12/2012 | Kusterer et al. |
| 2013/0026492 | A1 | 1/2013 | Khan |
| 2013/0082241 | A1 | 4/2013 | Kub et al. |
| 2013/0145857 | A1 | 6/2013 | Bryant et al. |
| 2013/0194048 | A1 | 8/2013 | Feng et al. |
| 2013/0320295 | A1 | 12/2013 | Rao et al. |
| 2013/0333094 | A1 | 12/2013 | Rogers et al. |
| 2014/0150713 | A1 * | 6/2014 | Coe ...................... C23C 16/274 117/88 |
| 2015/0092925 | A1 | 4/2015 | Stoupin et al. |

OTHER PUBLICATIONS

American Institute of Physics, Scientists Carve Nanowire Out of Ultrananocrystalline Diamond Thin Films, Nov. 4, 2011, 1 page.
Aslam, et al., "Piezorsistivity in vapor-deposited diamond films," Applied Physics Letters, vol. 60, Issue 23, Jun. 8, 1992, 3 pages.
Auciello, et al, Are Diamonds a MEMS' Best Friend?, IEEE Microwave Magazine, Dec. 2007, 15 pages.
Baryshev, et al., "Planar ultrananocrystalline diamond field emitter in accelerator radio frequency electron injector: Performance metrics," Applied Physics Letters, vol. 105, No. 203505 Nov. 18, 2014, pp. 203505-1-203505-5.
Butler, et al., "The CVD of Nanodiamond Materials," Chemical Vapor Deposition, vol. 14, Aug. 15, 2008, 16 pages.
Dai, et al., "Optically Transparent Diamond Electrode for Use in IR Transmission Spectroelectrochemical Measurements", Analytical Chemistry, vol. 79, No. 19, Oct. 1, 2007, 8 pages.
Ex Parte Quayle Action for U.S. Appl. No. 14/601,908, dated Mar. 30, 2016, 9 pages.
Fischetti, et al., Band structure, deformation potentials, and carrier mobility in strained Si, Ge, and SiGe alloys, Journal of Applied Physics, vol. 80, No. 4, Aug. 15, 1996, 19 pages.
Gaowei, Responsive Study of Diamond X-Ray Monitors with nUNCD Contact Proc. of IPAC 2015, Jun. 2015, pp. 1273-1275.
Gerbi, et al., Electrical Contacts to ultrananocrystalline diamond, Applied Physics Letters, vol. 83, No. 10, Sep. 8, 2003, 3 pages.
Goyal, et al., "Direct Low-Temperature Integration of Nanocrystalline Diamond with GaN Substrates for Improved Thermal Management of High-Power Electronics", Advanced Functional Materials Journal, Feb. 1, 2012, 22, 1525-1530.
Grimes, Jacob T., "A Prototype Diamond Amplified Photocathode", Master of Science Thesis, Stony Brook University, May 2007, pp. ii-102.
Gruen, et al., "Configurational, electronic entropies and the thermoelectric properties of nanocarbon ensembles," Applied Physics Letters, vol. 92, Issue 14, No. 143118, Apr. 11, 2008, 3 pages.
He, et al., "Giant piezoresistance effect in silicon nanowires," Nature Nanotechnology, vol. 1, Oct. 2006, 5 pages.
Ieong, et al., "Silicon Device Scaling to the Sub-10-nm Regime," Science, vol. 306, Dec. 17, 2004, 4 pages.
Kulha et al., Design and Fabrication of Piezoresistive Strain Gauges Based on Nanocrystalline Diamond Layers, 2011, 4 pages.
Notice of Allowance for U.S. Appl. No. 14/594,949, dated Apr. 1, 2016, 10 pages.
Notice of Allowance for U.S. Appl. No. 14/790,995, dated Jun. 24, 2016, 12 pages.
Notice of Allowance for U.S. Appl. No. 14/790,995, dated Jun. 24, 2016, 16 pages.
Notice of Allowance on U.S. Appl. No. 14/594,949, dated Jul. 13, 2016, 3 pages.
Notice of Allowance on U.S. Appl. No. 14/601,908, dated May 9, 2016, 7 pages.
Office Action for U.S. Appl. No. 14/796,527 dated Sep. 13, 2016 6 pages.
Perez, et al., "High quantum efficiency ultrananocrystalline diamond photocathode for photoinjector applications," Applied Physics Letters, vol. 105 Sep. 22, 2014, pp. 123103-1-123103-4.
Rameau, et al., "Properties of Hydrogen Terminated Diamond as a Photocathode", Physical Review Letters, Abstract, vol. 106, Issue 137602, Mar. 30, 2011, 4 pages.
Search Report and Written Opinion for International Application No. PCT/US2016/013708, dated Jul. 28, 2016, 11 pages.
Search Report for International Application No. PCT/US2016/040456, dated Nov. 4, 2016, 4 pages.
Stotter et al., "Optical and Electrochemical Properties of Optically Transparent, Boron-Doped Diamond Thin Films Deposited on Quartz" Analytical Chemistry, vol. 74, No. 23, Dec. 1, 2002, 7 pages.
Sumant,et al., "High Quantum Efficiency Photocathodes Based on Ultrananocrystalline Diamond Operating Between 250 nm and Visible Blue", Slide Presentation, by Argonne and U.S. Department of Energy, Nov. 24, 2014,p. 1-7.
Tremsin & Siegmund, "Polycrystalline diamond films as prospective UV photocathodes," Proceedings SPIE, vol. 4139, Dec. 18, 2000, pp. 1-9.
U.S. Notice of Allowance on U.S. Appl. No. 14/790,995 dated Oct. 5, 2016.
U.S. Office Action on U.S. Appl. No. 14/796,527 dated Sep. 13, 2016.
Wang et al., Piezoresistivity of Polycrystalline P-type Diamond Films of Various Doping Levels at Different Temperatures, Jul. 15, 1997, 5 pages.
Werner, et al., "Review on diamond based piezoresistive sensors." Industrial Electronics, Jul. 1998, IEEE International Symposium, vol. 1, 6 pages.
Berman & Krim, "Surface science, MEMS and NEMS: Progress and opportunities for surface science research performed on, or by, microdevices," Progress in Surface Science 88(2), pp. 171-211 (2013).
Extended European Search Report for EP App. No. 16740540.6 dated Aug. 9, 2018, 15 pages.
Liao, et al., "Suspended Single-Crystal Diamond Nanowires for High-Performance Nanoelectromechanical Switches," Advanced Materials 22(47), pp. 5393-5997 (2010).
Taher, et al., "Piezoresistive microsensors using p-type CVD diamond films," Sensors and Actuators A: Physical 45(1), pp. 35-43 (1994).
Wang, et al., "Nanopatterning of ultrananocrystalline diamond nanowires," Nanotechnology 23(7), 7 pages (2012).
Bhattacharyya, et al., "Synthesis and characterization of highly-conducting nitrogen-doped ultrananocrystalline diamond films," Applied Physics Letters 79(10), pp. 1441-1443 (2001).

(56) References Cited

OTHER PUBLICATIONS

Gaowei, et al., "Responsivity Study of Diamond X-Ray Monitors with nUNCD Contact," Proceedings of the 6th International Particle Accelerator Conference, 3 pages (2015).
U.S. Office Action on U.S. Appl. No. 15/339,295 dated Jun. 1, 2017.

* cited by examiner

Glass wafer coated with low temperature deposited transparent NCD film

Glass wafer coated with a low temperature deposited transparent NCD film which is implanted with boron and phosphorous

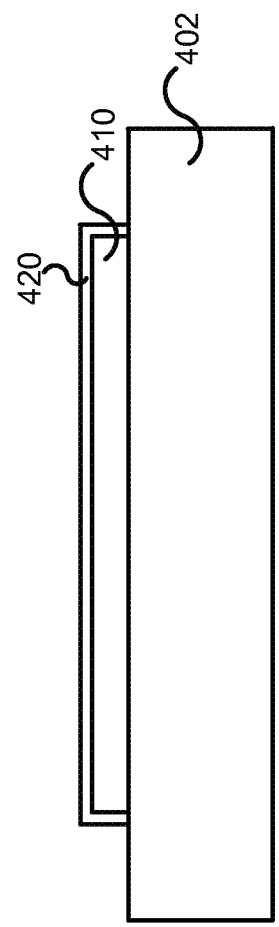

FIG. 10
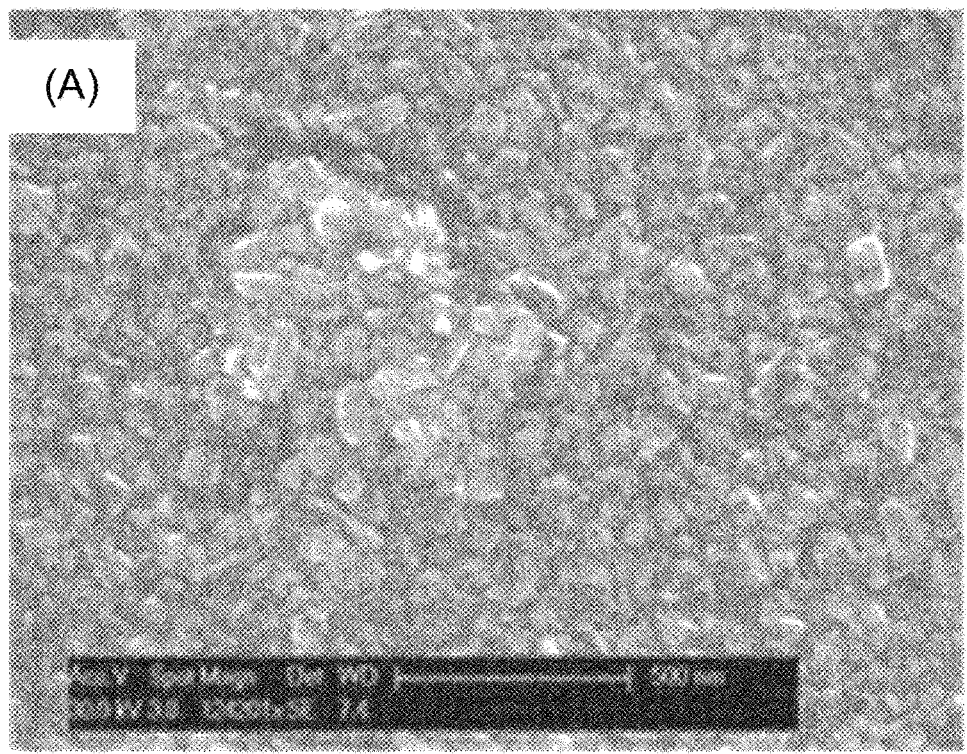
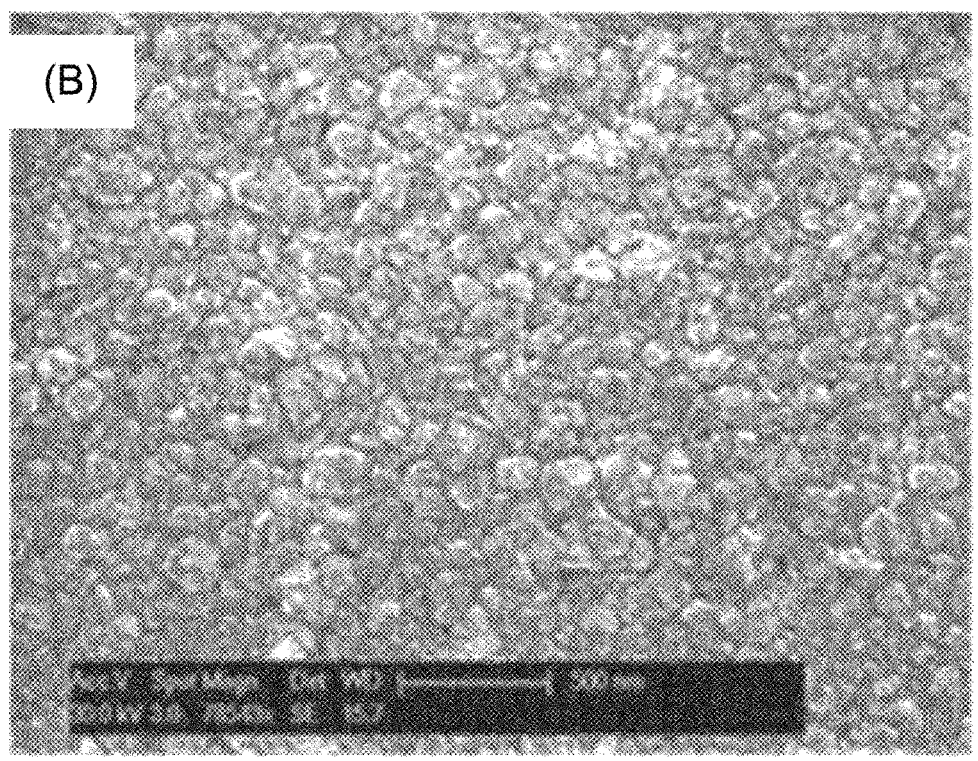

TRANSPARENT NANOCRYSTALLINE DIAMOND COATINGS AND DEVICES

CROSS-REFERENCE TO RELATED APPLICATIONS

This application is a divisional of U.S. patent application Ser. No. 14/796,527 filed Jul. 10, 2015, the content of which is hereby incorporated by reference in its entirety.

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to methods for fabricating transparent films and devices.

BACKGROUND

Transparent coatings find numerous applications in modern devices. For example, transparent coatings can be used for coating windshields, air craft windows, cell phone screens, tablet screens, computer screens, weapon heads, field deployed sensors, lasers, light emitting diodes (LEDs), etc. These coatings need to be transparent, scratch resistant, have high hardness, corrosion resistance, and generally provide protection from the environment.

State of the art transparent coatings are often deposited at high temperatures, for example, a temperature of greater than about 500 degrees Celsius. Such state of the art coatings are often formed from oxides (e.g., titanium oxide, indium tin oxide, aluminum doped zinc oxide, zinc doped indium oxide, etc.) which do not possess high wear resistance and can degrade in corrosive environments.

Furthermore, there is also an increasing demand for transparent semi-conductor devices. For example, traditional solar cells are fabricated on silicon which is opaque. Only one surface of such solar cells is available for receiving light and generating electricity therefrom. There is also a demand for other semi-conductor devices such as p-n junction devices, LEDs, other diodes, transistors, etc.

Moreover, high power high temperature semi-conductor devices produce a substantial amount of heat which needs to be dissipated for proper operation of the semi-conductor devices. Coatings can be used to provide heat dissipation. Conventional coatings for thermal management or otherwise dissipation of heat produced by such semi-conductor devices are generally disposed at high temperatures (e.g., greater than 800 degrees Celsius). At such high temperatures, the semi-conductor materials used to fabricate the semi-conductor devices (e.g., gallium nitride (GaN), gallium arsenide (GaAs), indium gallium nitride (InGaN), aluminum GaN (AlGaN), etc.) become unstable and can degrade. Furthermore, for some semi-conductor devices such as LEDS, the thermal management coatings should be transparent to allow flow of photons through the coating.

SUMMARY

Embodiments described herein relate generally to methods for fabricating transparent films and devices; and in particular to methods for fabricating transparent nanocrystalline diamond (NCD) coatings, and transparent NCD devices.

In some embodiments, a method for coating a substrate comprises producing a plasma ball using a microwave plasma source in the presence of a mixture of gases. The plasma ball has a diameter. The plasma ball is disposed at a first distance from the substrate and the substrate is maintained at a first temperature. The plasma ball is maintained at the first distance from the substrate, and a diamond coating is deposited on the substrate. The diamond coating has a thickness. Furthermore, the diamond coating has an optical transparency of greater than about 80% in the visible spectrum. In particular embodiments, the diamond coating includes NCD. In one embodiment, the microwave plasma source has a frequency of about 915 MHz.

In other embodiments, a method for forming a transparent semi-conductor device comprises producing a plasma ball using a microwave plasma source in the presence of a mixture of gases. The plasma ball has a diameter. The plasma ball is disposed at a first distance from the substrate and the substrate is maintained at a first temperature. The plasma ball is maintained at the first distance from the substrate for a first time, and a NCD coating is deposited on the substrate. The NCD coating has a thickness, and possesses an optical transparency of greater than about 80%. The NCD coating is implanted with at least one of a p-type dopant and an n-type dopant. The substrate with the NCD coating disposed thereon is annealed at a second temperature for a second time. In one embodiment, the NCD coating is deposited using a microwave plasma source having a frequency of about 915 MHz.

In still other embodiments, a p-n junction device comprises substrate which includes a NCD. The NCD comprises a first portion doped with a p-type dopant and a second portion doped with an n-type dopant such that a depletion zone is formed between the first portion and the second portion. The NCD has an optical transparency of greater than about 80%. In some embodiments, the p-type dopant includes boron and the n-type dopant includes phosphorous. In further embodiments, the p-n junction device includes a diode, a solar cell, a transistor, or a LED.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 8 is a schematic illustration of a semi-conductor device disposed on a substrate and overcoated with a transparent NCD film, according to an embodiment.

FIG. 10 panel A is an SEM image of a 150 nm thick NCD film and FIG. 10 panel B is an SEM image of a 300 nm thick NCD film disposed on a gallium nitride (GaN) substrate.

Figure 1:
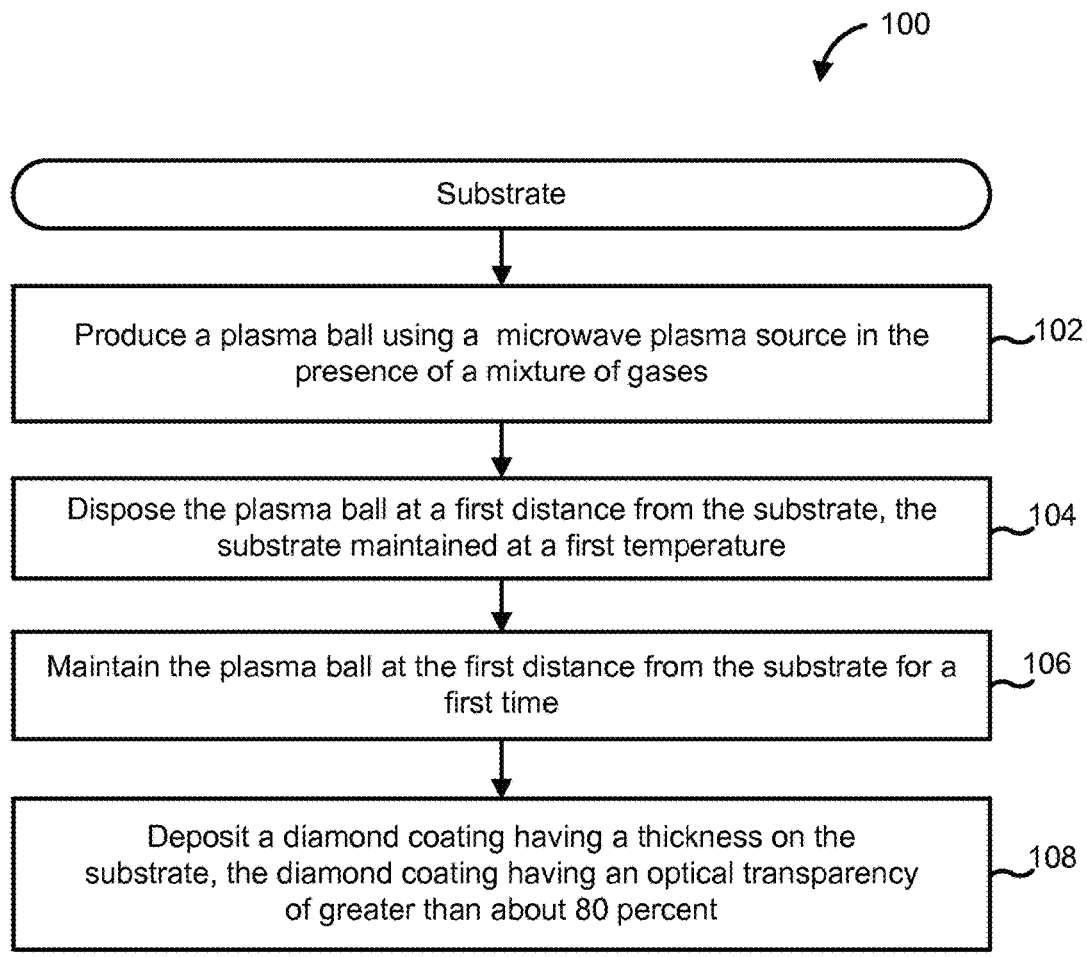
FIG. 1 is a schematic flow diagram of an exemplary method for coating a substrate with a transparent diamond coating, according to an embodiment.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to methods for fabricating transparent films and devices; and in particular to methods for fabricating transparent nanocrystalline diamond (NCD) coatings, and transparent NCD devices.

Embodiments of the transparent NCD coatings and transparent semi-conductor devices formed therefrom provide several benefits including, for example: (1) having a transparency of greater than about 80%; (2) coating at low temperatures; (3) having extreme hardness, wear resistance and scratch resistance; (4) resisting acidic and corrosive environments; (5) providing hydrophobic properties; (6) capability to withstand temperatures of up to about 600 degrees Celsius in air and about 1,000 degrees Celsius in vacuum; (7) maintaining high optical transparency even after doping with p-type or n-type dopants; and (8) allowing fabrication of transparent semi-conductor devices such as, for example, p-n junction devices, solar cells, LEDs, P-I-N diodes, transistors, etc.

As used herein, the term "nanocrystalline diamond (NCD)" refers to crystalline diamond that has a grain size in the range of 10 nm to 200 nm.

FIG. 1 is a schematic flow diagram of an exemplary method 100 for coating a substrate with a transparent diamond film. The method 100 comprises producing a plasma ball using a microwave plasma source in the presence of a mixture of gases, at 102. In one embodiment, the microwave plasma source has a frequency of about 915 MHz. The substrate can have any shape or size (e.g., a sheet, a block, a wafer, etc.) and can be formed from any suitable material. In some embodiments, the substrate can be formed from an inherently transparent material, for example silicon oxide, quartz, sapphire, fused silica, diamond, Pyrex, aluminum oxide, magnesium oxide, indium tin oxide, transparent ceramics or any other transparent material.

In other embodiments, the substrate can be formed from an semi-conductor material, for example gallium nitride, aluminum gallium nitride, gallium arsenide, silicon and germanium. These semi-conductor materials are generally opaque. In particular embodiments, the substrate formed from any one of these semi-conductor materials can have a thickness less than a thickness threshold (e.g., having a thickness of less than 200 nm) such that a substantial portion (e.g., greater than 80%) of light incident on the substrate can pass through the substrate. In other words the thickness of the substrate formed from such-semi-conductor materials is thin enough that the substrate is transparent, for example has an optical transparency of greater than 80%.

In such implementations, the semi-conductor material having a thickness less than the thickness threshold can be deposited on a base substrate or a handle substrate at a low temperature (e.g., less than 400 degrees Celsius) which serves to provide mechanical support and structural integrity to the thin semi-conductor film. In some embodiments, the base substrate can include a transparent substrate silicon oxide, quartz, sapphire, fused silica, diamond, Pyrex, aluminum oxide, magnesium oxide, indium tin oxide, transparent ceramics or any other transparent material such that the base substrate, the substrate. In other embodiments, the base substrate can include an opaque substrate which can be removed for predetermined areas to make a significant portion of the semi-conductor substrate and the NCD area transparent.

Furthermore, active or passive semi-conductor devices can be formed in such semi-conductor substrates. In one embodiments, the transparent diamond formed using the method 100 as described herein is deposited on a first side of the substrate which includes the semi-conductor devices so that the coating contacts the devices. In specific embodiments, a transparent insulating layer, for example a silicon oxide layer can be deposited between the semi-conductor devices and the diamond coating to insulated the semi-conductor devices from the diamond coating. In other embodiments, the diamond coating can be deposited on a second side of the substrate opposite the first side which does not include the semi-conductor devices such that the diamond coating does not contact the semi-conductor devices.

In still other embodiments, the substrate can include an opaque conductive material, for example metals and alloys. As described before, the conductive substrate can have a thickness (e.g., greater than 80%) such that the conductive substrate has an optical transparency of greater than 80%.

The substrate can be disposed in an internal volume defined by a chamber. The chamber can be sealed and any air or otherwise gases contained within the chamber can be evacuated by applying a vacuum to the chamber. The mixture of gases can be introduced into the internal volume of the chamber. In some embodiments, the mixture of gases can include argon, methane (e.g., about 0.1% to 1% by volume) and hydrogen (e.g., about 5% to about 10% by volume).

The substrate can be disposed on a substrate heater positioned within the chamber. A microwave frequency, for example, of about 915 MHz is introduced into the chamber to produce the plasma ball. For example, a microwave probe or otherwise antenna positioned in the chamber (e.g., a quartz bell jar) can introduce the microwave in a resonant cavity within the chamber to produce the plasma ball above the substrate. The plasma ball has a diameter which can be in the range of about 15 cms to about 30 cms, for example, about 16 cms, 18 cms, 20 cm, 22 cms, 24 cms, 26 cms, 28 cms or about 29 cms inclusive of all ranges and values there between. In one embodiment, the diameter of the plasma ball can be about 25 cms.

The plasma ball is disposed at a first distance from the substrate and the substrate is maintained at a first temperature at 104, for example via the substrate heater. In some embodiments, the distance of the plasma ball from the substrate can be controlled by adjusting a distance of the microwave probe or otherwise antenna from the substrate. In particular embodiments, the distance of the plasma ball from the substrate can be about 0.5 mm to about 5 mm (e.g., about 1 mm, 2 mm, 3 mm, or about 4 mm) inclusive of all ranges and values there between.

As described herein, the substrate is maintained at the first temperature. For example, the substrate can be disposed on the substrate heater which can be configured to heat the substrate and maintain the substrate at the first temperature. In some embodiments, the first temperature can be in the range of about 200 degrees Celsius to about 450 degrees Celsius (e.g., about 220 degrees Celsius, 240 degrees Celsius, 260 degrees Celsius, 280 degrees Celsius, 300 degrees Celsius, 320 degrees Celsius, 340 degrees Celsius, 360 degrees Celsius, 380 degrees Celsius, 400 degrees Celsius, 420 degrees Celsius, or about 440 degrees Celsius, inclusive of all ranges and values therebetween.

The plasma ball is maintained at the first distance from the substrate for a first time, at 106. In some embodiments, the first time can be about 20 minutes to about 60 minutes (e.g., about 25 minutes, 30 minutes, 35 minutes, 40 minutes, 45 minutes, 50 minutes, or about 55 minutes inclusive of all ranges and values there between).

A diamond coating is deposited on the substrate, at 108. The diamond coating has a transparency of greater than about 80%, for example, 81%, 82%, 83%, 84%, 85%, 86%, 87%, 88%, 89%, 90%, 91%, 92%, 93%, 94% or about 95% inclusive of all ranges and values therebetween. In particular embodiments, the diamond coating disposed on the substrate includes a NCD coating. The diamond coating has a thickness, for example, between 30 nms to about 150 nms (e.g., about 30 nms, 40 nms, 50 nms, 60 nms, 70 nms, 80 nms, 90 nms, 100 nms, 110 nms, 120 nms, 130 nms, 140 nms, or about 150 nms inclusive of all ranges and values there between). Furthermore, the diamond coating can have a root mean square (RMS) roughness of less than 7 nms.

Controlling the diameter of the plasma ball (e.g., between 15 cms and 30 cms) and the distance that the plasma ball can be disposed from the substrate (e.g., between 0.5 mm and 5 mm) allows the plasma ball to be placed closer to the substrate. This enables deposition of the diamond coating on a larger surface and in a shorter amount of time, which reduces cost.

The transparent diamond coatings (e.g., transparent NCD coatings) formed using method 100 can have extremely high hardness, be scratch resistant, wear resistant, hydrophobic and/or corrosion resistant. Such coatings can find numerous applications such as, protective coatings for cellular phones, tablets, computers, LEDs, lasers, sensors, weapon heads, etc.

Figure 2:
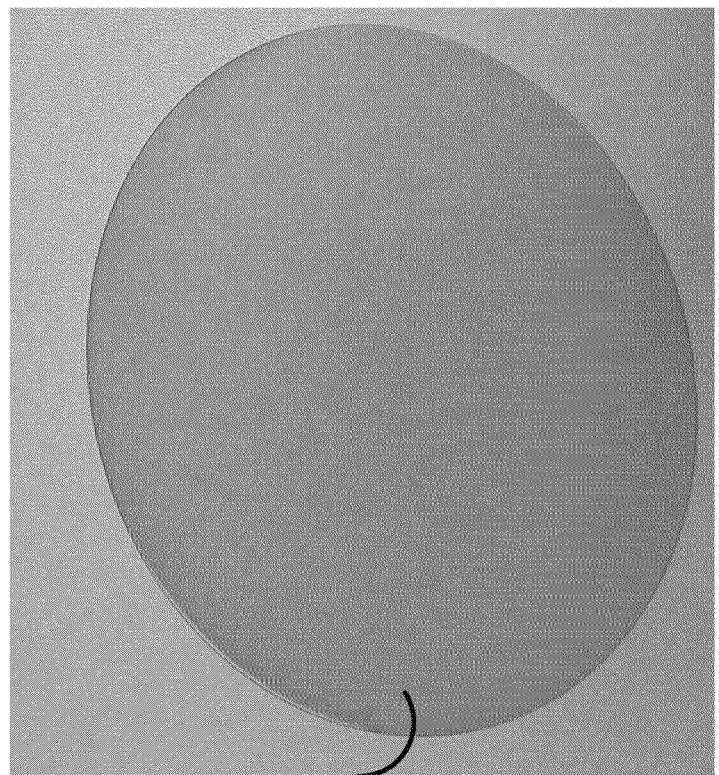
FIG. 2 is an image of a glass wafer that is coated with a low temperature deposited transparent NCD film.

FIG. 2 shows an optical image of a glass wafer coated with an NCD coating. The glass wafer has a diameter of about 10 cms. The NCD coating was deposited using the method 100 and had thickness of approximately 142 nms and a refractive index "n" of 2.4. As seen in FIG. 2, the NCD coating is visually transparent and the surface on which the glass substrate is disposed can be seen clearly through the glass wafer. Furthermore, the NCD coating had a RMS roughness of less than 10 nms.

Figure 3:
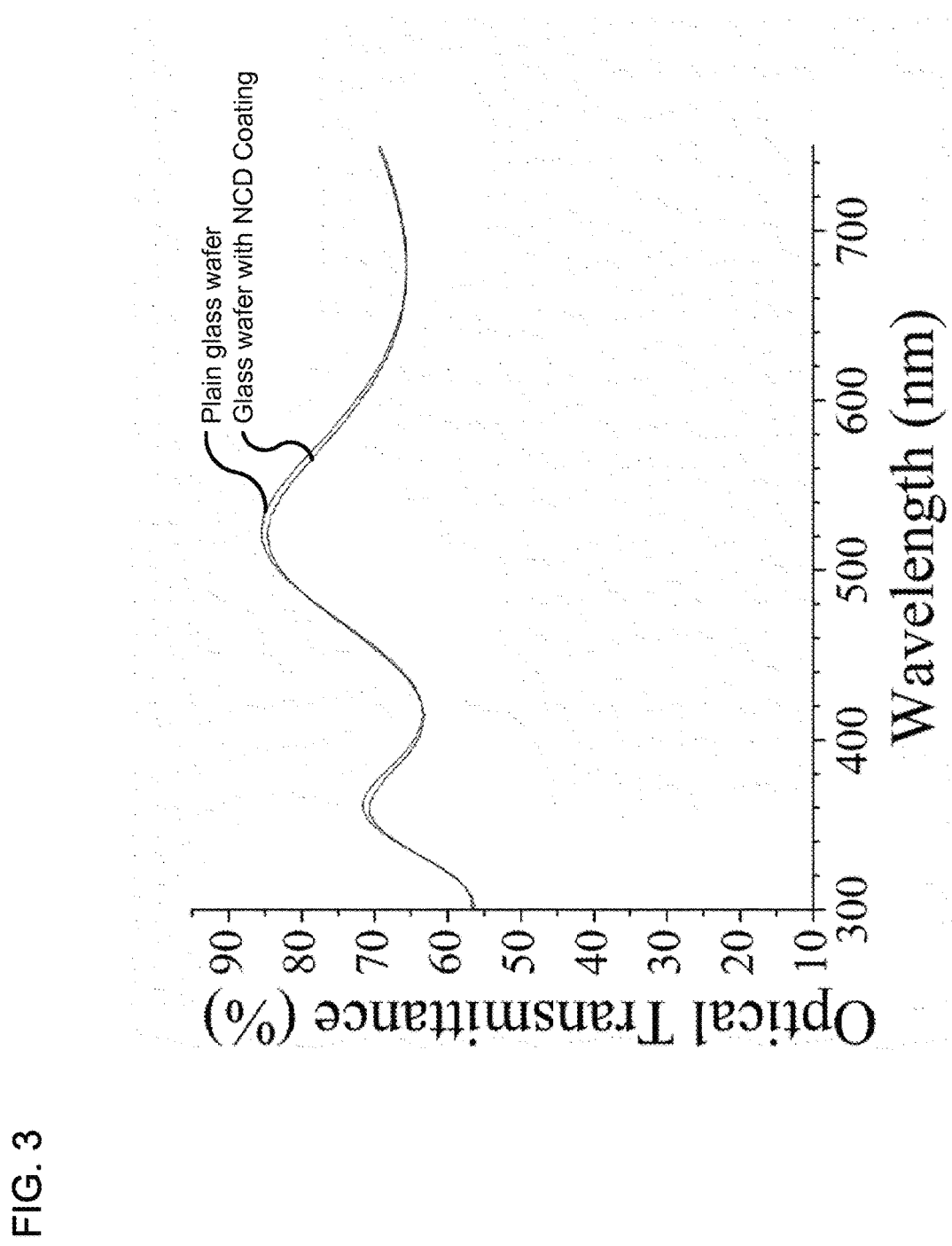
FIG. 3 is a plot of optical transmittance of a plain diamond wafer and a diamond wafer coated with a NCD coating.

FIG. 3 is a plot showing optical transmittance of a plain glass wafer and a glass wafer coated with an NCD film having a thickness of about 80 nm measured at various wavelengths. The optical transmittance of the plain glass wafer and the NCD coated glass wafer was about the same and had a peak optical transmittance of about 85% at a wavelength of about 520 nm.

Figure 4:
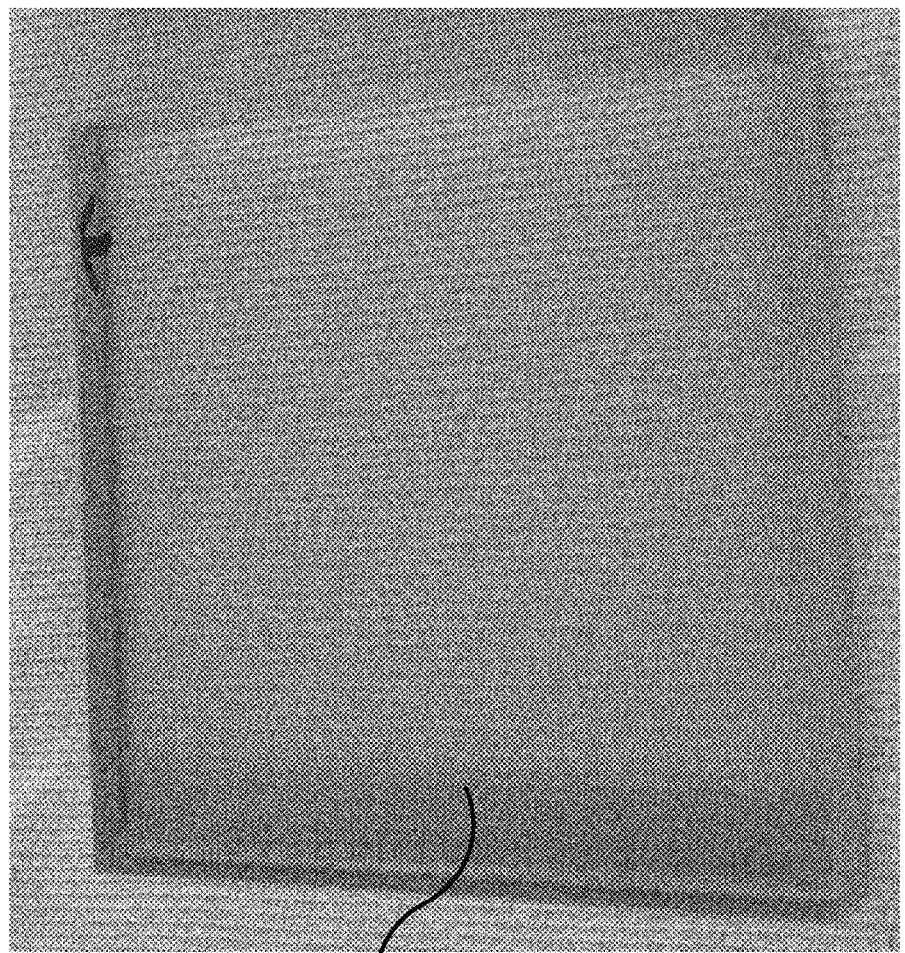
FIG. 4 is an image of a quartz block coated with a low temperature deposited transparent NCD film.

As described herein, the method 100 can be used to deposit a diamond (e.g., a NCD) coating on any suitable substrate such that the coating has a transparency of greater than about 80%. FIG. 4 shows a block of quartz that is coated with a NCD coating using the method 100. The NCD coating has a transparency of greater than about 80%, and the surface on which the NCD quartz block is disposed can be clearly seen through the quartz block.

The transparent NCD coatings or otherwise films described herein can be doped with dopants such as n-type dopants (phosphorous, arsenic, etc.) or p-type dopants (e.g., boron, aluminum) to form semi-conductor devices. The NCD film has transparency of greater than about 80% and can retain its transparency after the doping such that the semi-conductor devices formed from such NCD films also have a transparency of greater than about 80%.

Figure 5:
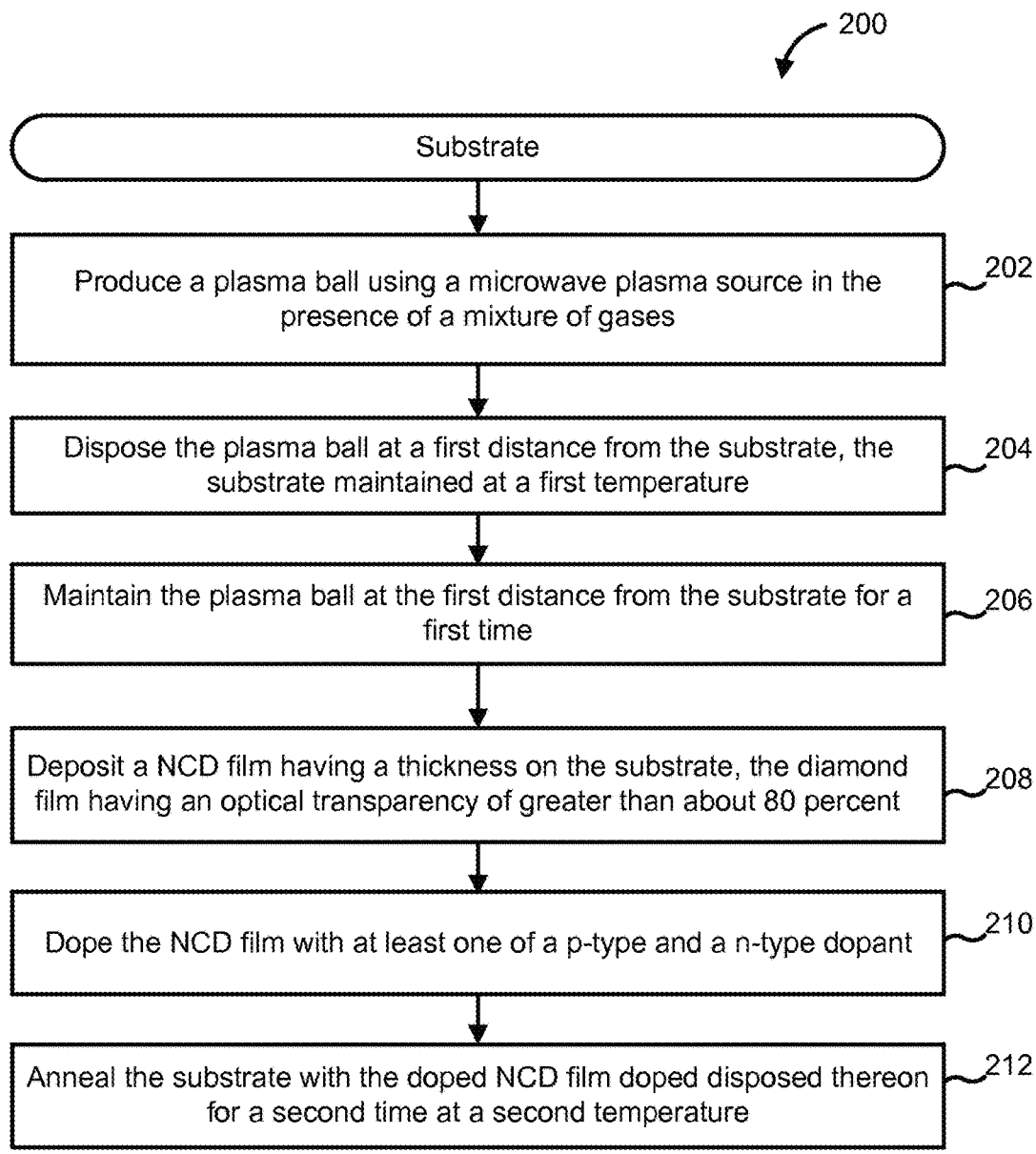
FIG. 5 is a schematic flow diagram of an exemplary method for forming a transparent semi-conductor device, according to another embodiment.

FIG. 5 is a schematic flow diagram of a method 200 for forming a transparent semi-conductor device. The transparent semi-conductor device can be formed on a substrate, for example, a transparent substrate such as glass, quartz, Pyrex, sapphire, diamond, fused silica, magnesium oxide or any other suitable transparent substrate. In other embodiments, the substrate can include a semi-conductor material (e.g., gallium nitride, gallium arsenide, silicon or germanium) having a thickness less than a thickness threshold (e.g., having a thickness of less than 200 nm) such that a substantial portion (e.g., greater than 80%) of light incident on the substrate can pass through the substrate. In other words the thickness of the substrate formed from such-semi-conductor materials is thin enough that the substrate is transparent, for example has an optical transparency of greater than 80%.

The method 200 includes producing a plasma ball using a microwave plasma source in the presence of a mixture of gases, at 202. In one embodiment, the microwave plasma source has a frequency of about 915 MHz. In another embodiment, the substrate can be disposed in an internal volume defined by chamber. The chamber can be sealed and air or otherwise gases contained within the chamber can be evacuated by applying a vacuum to the chamber. The mixture of gases can be introduced into the internal volume of the chamber. In some embodiments, the mixture of gases can include argon, methane (e.g., about 0.1% to 1% by volume) and hydrogen (e.g., about 5% to about 10% by volume).

The substrate can be disposed on a substrate heater positioned within the chamber. A microwave frequency, for example, of about 915 MHz is introduced into the chamber to produce the plasma ball. For example, a microwave probe or otherwise antenna positioned in the chamber (e.g., a quartz bell jar) can introduce the microwave in a resonant cavity within the chamber to produce the plasma ball above the substrate. The plasma ball has a diameter which can be in the range of about 15 cms to about 30 cms, for example, about 16 cms, 18 cms, 20 cm, 22 cms, 24 cms, 26 cms, 28 cms or about 29 cms inclusive of all ranges and values therebetween. In one embodiment, the diameter of the plasma ball can be about 25 cms.

The plasma ball is disposed at a first distance from the substrate and the substrate is maintained at a first temperature, at 204. For example, the substrate heater can be configured to heat the substrate and maintain the temperature of the substrate at the first temperature. In some embodiments, the distance of the plasma ball from the substrate can be about 0.5 mm to about 5 mm (e.g., about 1 mm, 2 mm, 3 mm, or about 4 mm) inclusive of all ranges and values therebetween).

As described herein, the substrate is maintained at the first temperature. In some embodiments, the first temperature can be in the range of about 200 degrees Celsius to about 450 degrees Celsius (e.g., about 220 degrees Celsius, 240 degrees Celsius, 260 degrees Celsius, 280 degrees Celsius, 300 degrees Celsius, 320 degrees Celsius, 340 degrees Celsius, 360 degrees Celsius, 380 degrees Celsius, 400 degrees Celsius, 420 degrees Celsius, or about 440 degrees Celsius, inclusive of all ranges and values therebetween).

The plasma ball is maintained at the first distance from the substrate for a first time, at 206. In some embodiments, the first time can be about 20 minutes to about 60 minutes (e.g., about 25 minutes, 30 minutes, 35 minutes, 40 minutes, 45 minutes, 50 minutes, or about 55 minutes inclusive of all ranges and values there between).

A NCD film is deposited on the substrate, at 208. The NCD film has a transparency of greater than about 80%, for example, 81%, 82%, 83%, 84%, 85%, 86%, 87%, 88%, 89%, 90%, 91%, 92%, 93% or about 94% inclusive of all ranges and values therebetween. The NCD film has a thickness, for example, between 30 nms to about 150 nms (e.g., about 30 nms, 40 nm, 50 nms, 60 nms, 70 nms, 80 nms, 90 nms, 100 nms, 110 nms, 120 nms, 130 nms, 140 nms, or about 150 nms inclusive of all ranges and values therebetween). Furthermore, the NCD film can have a root mean square (RMS) roughness of less than 7 nms.

The NCD film is doped with an n-type dopant (e.g., phosphorous) and/or a p-type dopant (e.g., boron). In some embodiments, NCD film can be implanted with the n-type and/or the p-type dopant to achieve the doping. In other embodiments, a donor of the n-type and/or the p-type dopant can be introduced during the NCD deposition process to incorporate the n-type and/or the p-type dopant into the NCD film.

The substrate with the doped NCD film disposed thereon is annealed for a second time to at second temperature, at 210. In one embodiment, the second time can be less than about 20 seconds (e.g., 15 seconds, 10 seconds, 5 seconds, or 1 second inclusive of all ranges and values therebetween). In other embodiments, the second temperature can be between about 80 degrees Celsius to about 1,200 hundred degrees Celsius (e.g., about 850, 900, 950, 1,000, 1,050, 1,100, or about 1,150 degrees Celsius inclusive of all ranges and values therebetween).

In further embodiments, multiple layers of dopants can be doped into the NCD film. For example, the NCD film can be doped with a p-type dopant and the NCD film annealed. The NCD film can then be doped with an n-type dopant and then annealed again. The operations can be repeated to obtain semi-conductor devices that are doped with multiple layers of dopants incorporated within the NCD film to obtain a desired device.

The method 200 can be used to form various transparent semi-conductors devices. Such devices can include p-n junction devices (e.g., solar cells, photocells, diodes, tunnel diodes, zener diodes, LEDs), PIN diodes, transistors, metal oxide semi-conductor field effect transistors (MOSFET), sensors (e.g., Hall effect sensors), integrated circuits, charge coupled devices (CCDs), ROMs, RAMs, LED displays (e.g., a television display, a smartphone display, a tablet display, a smart glass display or a heads up display (HUD)), etc. Such devices can also have other superior properties over conventional semi-conductor devices. For example, such devices can be scratch resistant, wear resistant, hydrophobic, and resist corrosion thereby have longer life.

Figure 6:
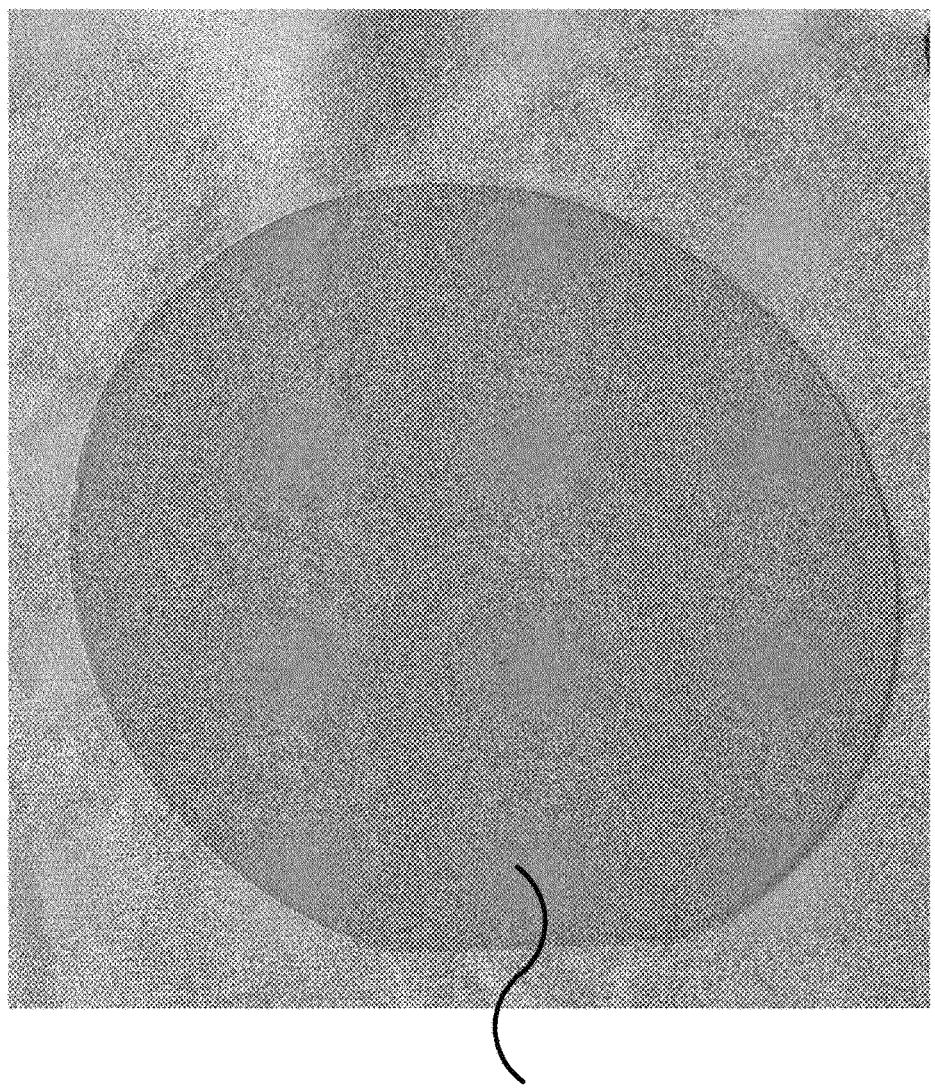
FIG. 6 is an image of a glass wafer coated with a transparent NCD film that is doped with boron and phosphorous.

FIG. 6 shows a glass wafer that is coated with a transparent NCD film having a thickness of about 80 nms. The NCD film is implanted with boron and phosphorous and has a transparency of greater than about 80%. This shows that the NCD films retain their transparency even after doping with n-type and p-type dopants, and thus can be used for fabricating transparent semi-conductor devices.

Figure 7:
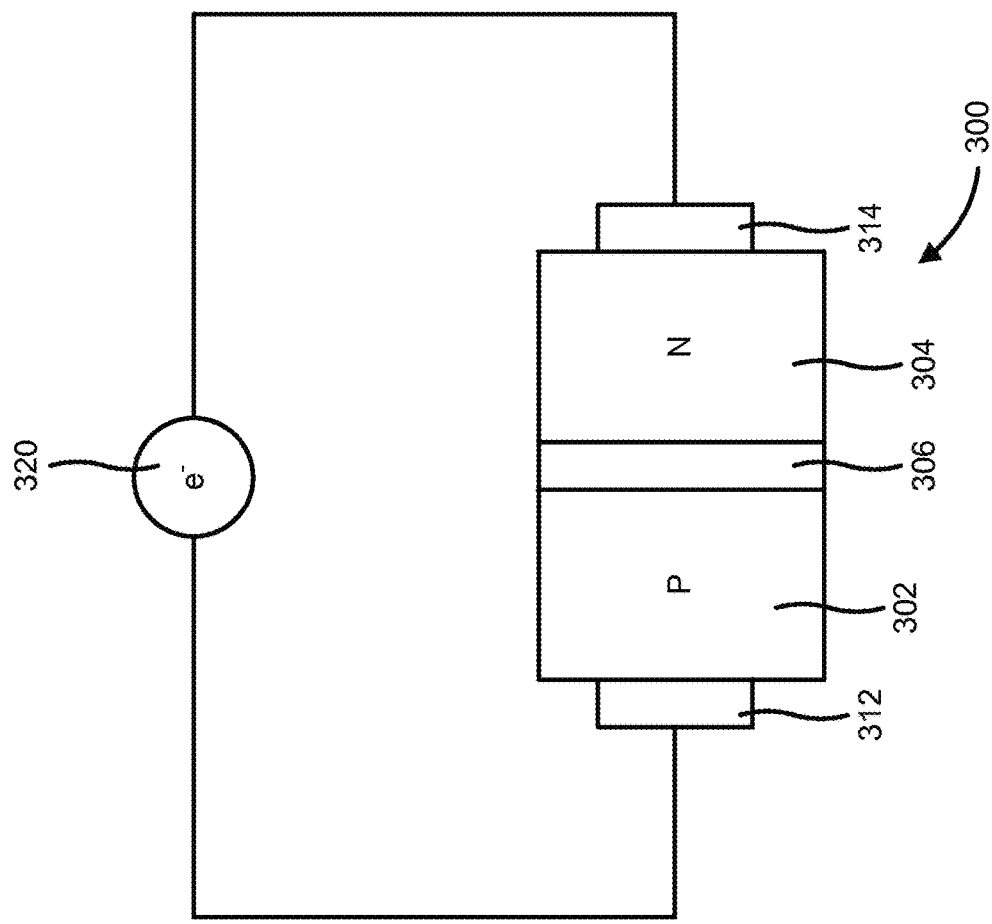
FIG. 7 is a schematic illustration of a transparent p-n junction device, according to yet another embodiment.

In some embodiments, a transparent semi-conductor device fabricated using a transparent NCD film can include a p-n junction device. FIG. 7 shows a p-n junction device 300 according to an embodiment. The p-n junction device 300 comprises a substrate that includes a nanocrystalline diamond. For example, the p-n junction device can include a transparent substrate, for example, a glass, Pyrex, sapphire, quartz, fused silica, magnesium oxide, indium tin oxide, aluminum oxide, indium tin oxide or diamond substrate on which an NCD film is disposed or deposited.

In still other embodiments, the substrate can include a semi-conductor material (e.g., gallium nitride, aluminum gallium nitride, gallium arsenide, silicon or germanium) having a thickness less than a thickness threshold (e.g., having a thickness of less than 200 nm) such that a substantial portion (e.g., greater than 80%) of light incident on the substrate can pass through the substrate. In other words the thickness of the substrate formed from such-semi-conductor materials is thin enough that the substrate is transparent, for example has an optical transparency of greater than substrate such that a combination of the NCD film and the semi-conductor substrate have an optical transparency of greater than 80%.

The NCD film can have a thickness in the range of about 30 nms to about 150 nms (e.g., about 30 nms, 40 nms, 50 nms, 60 nms, 70 nms, 80 nms, 90 nms, 100 nms, 110 nms, 120 nms, 130 nms, 140 nms, or about 150 nms inclusive of all ranges and values there between) and can be disposed on the substrate using method 100 or any other method described herein. Furthermore, the NCD has an optical transparency of greater than about 80%.

The NCD includes a first portion 302 doped with a p-type dopant, for example, boron, and a second portion 304 doped with a n-type dopant, for example, phosphorous. In some embodiments, the NCD can be doped with the p-type and the n-type dopant by implanting the NCD with the n-type and the p-type dopant and then annealing the NCD, as described herein with respect to method 200. The NCD maintains its transparency after being doped with the n-type dopant and the p-type dopant such that the p-n junction device is transparent (e.g., has a transparency of greater than about 80%).

A depletion zone 306 is formed between the first portion 302 and the second portion 304 such that the p-n junction is formed. In some embodiments, a first contact pad 312 can be electrically coupled to the first portion 302, and a second contact pad 314 can be electrically coupled to the second portion 304. The p-n junction device 300 can be coupled to electronic instrumentation 320 via the first contact pad 312 and the second contact pad 314.

In some embodiments, the p-n junction device 300 can include a solar cell which has a transparency of greater than about 80%. In such embodiments, the p-n junction 300 can receive light and emit a current which can be measured, used and/or stored by the electronic instrumentation 320. In other embodiments, the p-n junction device 300 can include a light emitting diode. In such embodiments, the electronic instrumentation 320 can be configured to apply a potential difference across the p-n junction device 300 to urge the p-n junction device 300 to emit photons. In still other embodiments, the p-n junction device 300 can include diodes, tunnel diodes, zener diodes PIN diodes, transistors, metal oxide semi-conductor field effect transistors (MOSFET), sensors (e.g., Hall effect sensors), integrated circuits, charge coupled devices (CCDs), ROMs, RAMs, etc.

The p-n junction device 300 or any other transparent electronic device fabricated in NCD can also include transparent electrical conductors disposed thereon, for example to allow interfacing with macro-electronics. Such materials can include but are not limited to indium phosphide, indium tin oxide or fluorine tin oxide.

In some embodiments, the low temperature NCD deposition methods (e.g., the method 100) or the transparent NCD films formed therefrom (e.g., having a transparency of greater than about 80%) can be used as high thermal conductivity coating films for semi-conductor devices. For example, FIG. 8 shows a semi-conductor device 410 disposed on a substrate 402, and coated with a NCD film 420.

The substrate 402 can be formed from any suitable substrate. In some embodiments, the substrate 402 can include a semi-conducting substrate (e.g., silicon, GaN, Ga—As, InGaN, AlN—GaN, etc.) within which the semi-conducting device 410 is fabricated. In some embodiments, the semi-conductor substrate can have a thickness less than a thickness threshold (e.g., having a thickness of less than 200 nm) such that the semi-conductor substrate/thin films has an optical transparency of greater than 80%, as described above. In other embodiments, the substrate 402 can include an inert and/or transparent substrate, for example, glass, quartz, sapphire, Pyrex, fused silica, magnesium oxide, aluminum oxide, diamond etc. In such embodiments, a semi-conducting material can be disposed over the substrate 402 (e.g., having a thickness of less than 200 nm) on which the semi-conducting device 410 can be fabricated.

The semi-conductor device 410 can include a high temperature and/or high power electronic device (e.g., ultra high power switches, microwave power sources, etc.), diodes, tunnel diodes, zener diodes PIN diodes, transistors, metal oxide semi-conductor field effect transistors (MOSFET), sensors (e.g., Hall effect sensors), integrated circuits, charge coupled devices (CCDs), ROMs, RAMs, any other semi-conductor device or a combination thereof. In some embodiments, the semi-conductor device 410 can include a gallium based semi-conductor device which can degrade at high temperatures, for example, temperatures of greater than about 600 degrees Celsius.

The NCD film 420 is disposed over the semi-conductor device 410 and is structured to provide a low resistance path for dissipating the heat produced by the semi-conductor devices. The NCD film 420 can be disposed over the semi-conductor device 410 using a low temperature (e.g., less than about 500 degrees Celsius) deposition process, for example, the method 100 or any other method described herein. In some embodiments, the thickness of the NCD film 420 can be in the range of about 30 nm to about 150 nm (e.g., about 30 nms, 40 nms, 50 nms, 60 nms, 70 nms, 80 nms, 90 nms, 100 nms, 110 nms, 120 nms, 130 nms, 140 nms, or about 150 nms inclusive of all ranges and values there between). In other embodiments, the grain size of the NCD film 420 can be in the range of about 10 nm to about 200 nm. In still other embodiments, the grain size of the NCD film 420 can greater than about 200 nm.

Furthermore, the NCD film 420 can have a thermal conductivity substantially higher than the substrate 402 and the semi-conductor device 410. In some embodiments, the thermal conductivity of the NCD film 420 can be in the range of about 300 Watt per meter Kelvin (W/m-K) to about 1,200 W/m-K (e.g., 300, 400, 500, 600, 700, 800, 900, 1,000, 1,100 or about 1,200 W/m-K inclusive of all ranges and values therebetween). The NCD film can also have a high transparency for example, greater than about 80%. In some embodiments, a second NCD film (not shown) can also be disposed on a back surface of the substrate 402 which is opposite to a surface on which the semi-conductor device 410 is disposed. The second NCD film can further facilitate heat transfer from the back surface of the substrate 402. In still other embodiments, only the second film NCD film is deposited on the back surface of the substrate such that the NCD film deposited over the semi-conductor device is excluded. That is only the back surface of the substrate is coated with the NCD film so that all heat transfer facilitated by the NCD film is via the back surface.

Figure 9A:
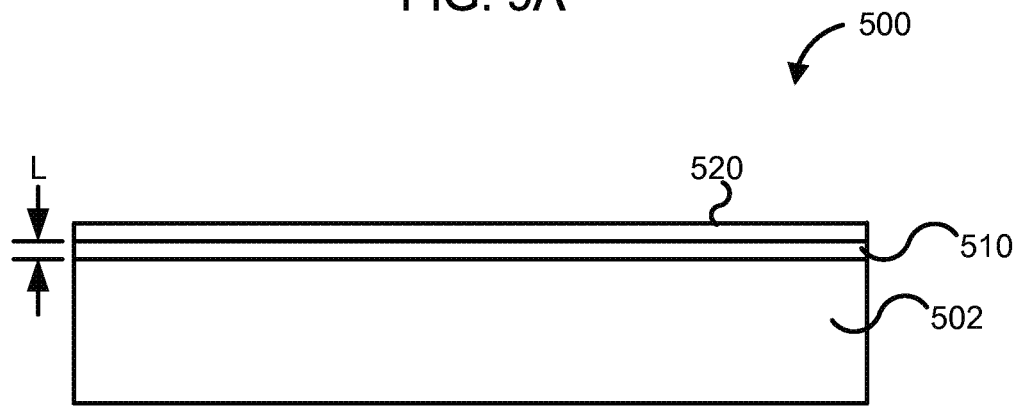
FIG. 9A is a schematic illustration of a device having a semi-conductor substrate which is opaque in bulk but has a sufficiently low thickness to appear transparent. The semi-conductor substrate is disposed on a transparent base substrate and coated with a NCD film.

As described before, in some embodiments substrate can be formed from an opaque material but has a sufficiently small thickness such that the substrate has an optical transparency of greater than about 80% i.e., appears transparent. For example, FIG. 9A is a schematic illustration of a device that includes a semi-conductor substrate 510 which can include an electronic device (e.g., a p-n junction device or any other electronic device defined therewithin).

The semi-conductor substrate 510 is formed from an opaque semi-conductor material such as gallium nitride, aluminum gallium nitride, gallium arsenide, silicon and germanium. While the bulk semi-conductor 510 material is opaque, the semi-conductor substrate 510 has a thickness L which is less than a thickness threshold (e.g., less than about 200 nm) such that semi-conductor substrate 510 has an optical transparency of greater than about 80%, and appears transparent.

The small thickness of the semi-conductor substrate 510 causes the semi-conductor substrate 510 to be mechanically fragile. To provide mechanical support to the semi-conductor substrate 510, the semi-conductor substrate 510 is positioned on a base substrate 502. For example, the semi-conductor substrate 510 can be deposited or grown on the base substrate 502. The base substrate has a thickness which is significantly larger than the thickness of the semi-conductor material 510 (e.g., in the range of 300 microns to 1,000 microns). Thus, the base substrate 502 has a significantly higher mechanical strength and rigidity than the semi-conductor substrate 510 and therefore provides mechanical support to the thin semi-conductor substrate 510.

Furthermore, the base substrate 502 is formed from an inherently optically transparent material (e.g., a material having an optical transparency of greater than 90%) such as, for example silicon oxide, quartz, sapphire, fused silica, diamond, Pyrex, aluminum oxide, magnesium oxide, indium tin oxide, transparent ceramics or any other transparent material. Thus, the combination of the semi-conductor substrate 510 and the transparent base substrate 502 may still have an optical transparency of greater than about 80%.

An NCD film 520 having an optical transparency of greater than 80% is disposed at a low-temperature (e.g., at a temperature of less than 400 degrees Celsius) on the semi-conductor substrate 510, for example, using the method 100 or any other method described herein. The low temperature deposition prevents damage to the semi-conductor substrate. Furthermore, since each of the base substrate 502, the thin semi-conductor substrate 510 and the NCD film have an optical transparency of at least greater than 80%, the device 500 may also have an optical transparency of greater than 80%, and is therefore sufficiently transparent.

Figure 9B:
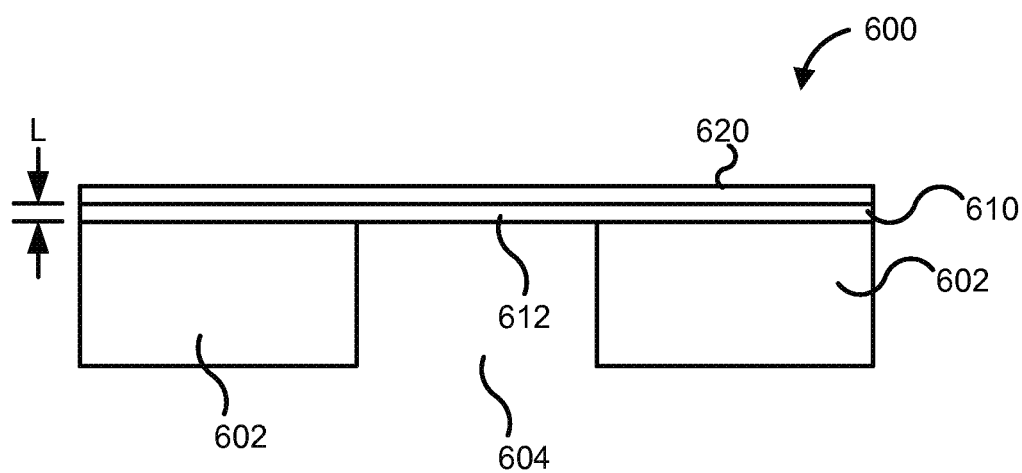
FIG. 9B is a schematic illustration of another device having a semi-conductor substrate which is opaque in bulk but has a sufficiently low thickness to appear transparent. The semi-conductor substrate is disposed on an opaque base substrate which defines a recess a predetermined location where the device is transparent, and an NCD film is deposited on the semi-conductor substrate.

FIG. 9B is a schematic illustration of another device that includes a semi-conductor substrate 610 which can include an electronic device (e.g., a p-n junction device or any other electronic device defined therewithin). The semi-conductor 610 is formed from an opaque semi-conductor material such as gallium nitride, aluminum gallium nitride, gallium arsenide, silicon and germanium. While the bulk semi-conductor 610 material is opaque, the semi-conductor substrate 610 has a thickness L which is less than a thickness threshold (e.g., less than about 200 nm) such that semi-conductor substrate 610 has an optical transparency of greater than about 80%, and appears transparent.

To provide mechanical support to the semi-conductor substrate 610, the semi-conductor substrate 610, the semi-conductor substrate is positioned on a base substrate 602 as described before. For example, the semi-conductor substrate 610 can be deposited or grown on the base substrate 602. The base substrate 602 has a thickness which is significantly larger than the thickness of the semi-conductor material 610 (e.g., in the range of 300 microns to 1,000 microns). Thus, the base substrate 602 has a significantly higher mechanical strength and rigidity than the semi-conductor substrate 610 thus providing mechanical support to the thin semi-conductor substrate 610.

However, unlike the base substrate 502 described with reference to the device 500, the base substrate 602 is formed from an inherently opaque material, for example silicon. An NCD film 620 having an optical transparency of greater than 80% is disposed at a low-temperature (e.g., at a temperature of less than 400 degrees Celsius) on the semi-conductor substrate 610, for example, using the method 100 or any other method described herein. The low temperature deposition prevents damage to the semi-conductor substrate 610.

A recess 604 is formed in the base substrate 602 at a predetermined location 612 of the semi-conductor substrate 610. For example, the base substrate 602 can be etched before or after depositing the NCD film to define the recess 612. As the opaque base substrate 602 is removed from the predetermined location 612, light can pass through the NCD films 620 and the thin semi-conductor substrate 610 at the predetermined location 612. Therefore, at least at the predetermined location 612, the device 600 has an optical transparency of greater than 80%.

Figure 11:
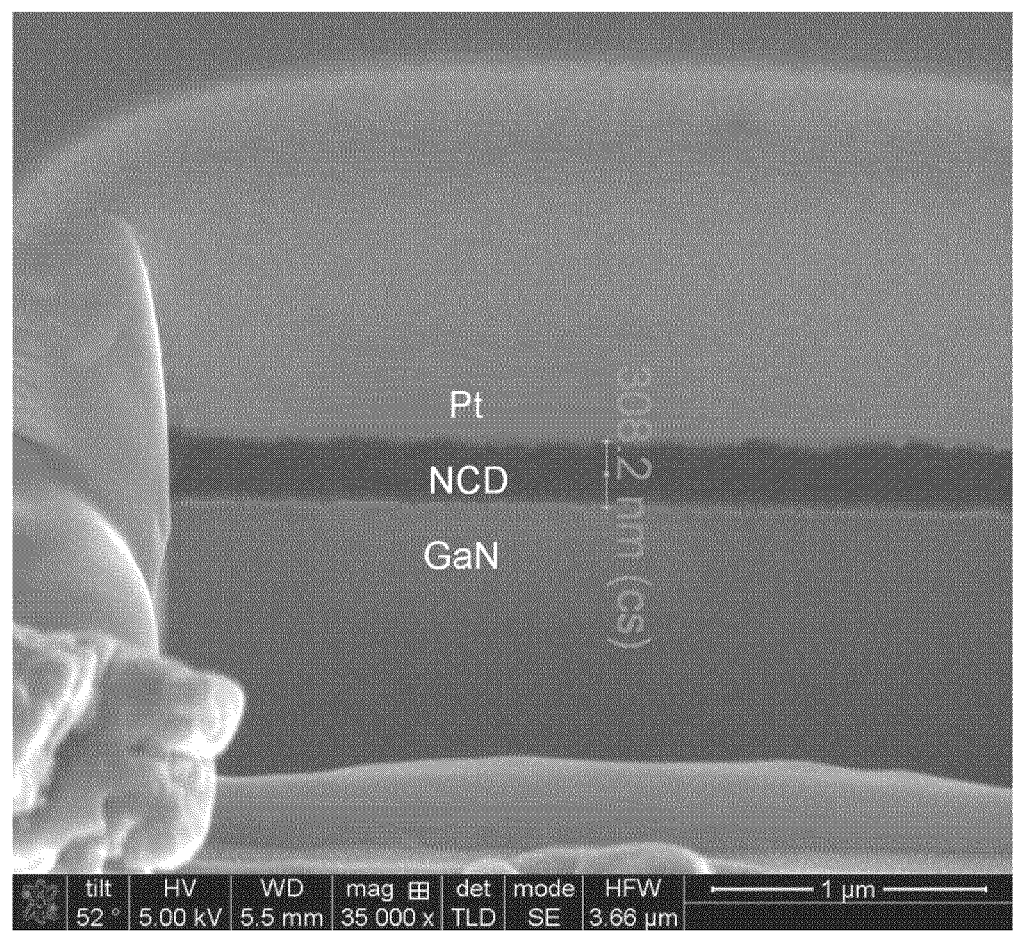
FIG. 11 is a focused ion beam (FIB) cross-section of the GaN substrate and the NCD film shown in FIG. 10 panel B.

FIG. 10 panel A shows an SEM image of a 150 nm thick NCD film disposed over a GaN substrate and FIG. 10 panel B shows another SEM image of a 300 nm thick NCD film disposed over another GaN substrate. The NCD films were deposited using a 915 MHz microwave plasma source in a mixture of argon, methane and hydrogen (5 vol %) and a substrate temperature of about 450 degrees Celsius. The images reveal that the grain sizes for both NCD films with different thicknesses are on the order of about 100 nm to about 200 nm The thickness of NCD films was verified using cross-sectional focused ion beam (FIB) slicing and SEM imaging as shown in FIG. 11. A thin layer of Pt was deposited locally on the NCD using FIB to obtain a much better edge resolution by avoiding the re-deposition during the FIB cut.

Figure 12:
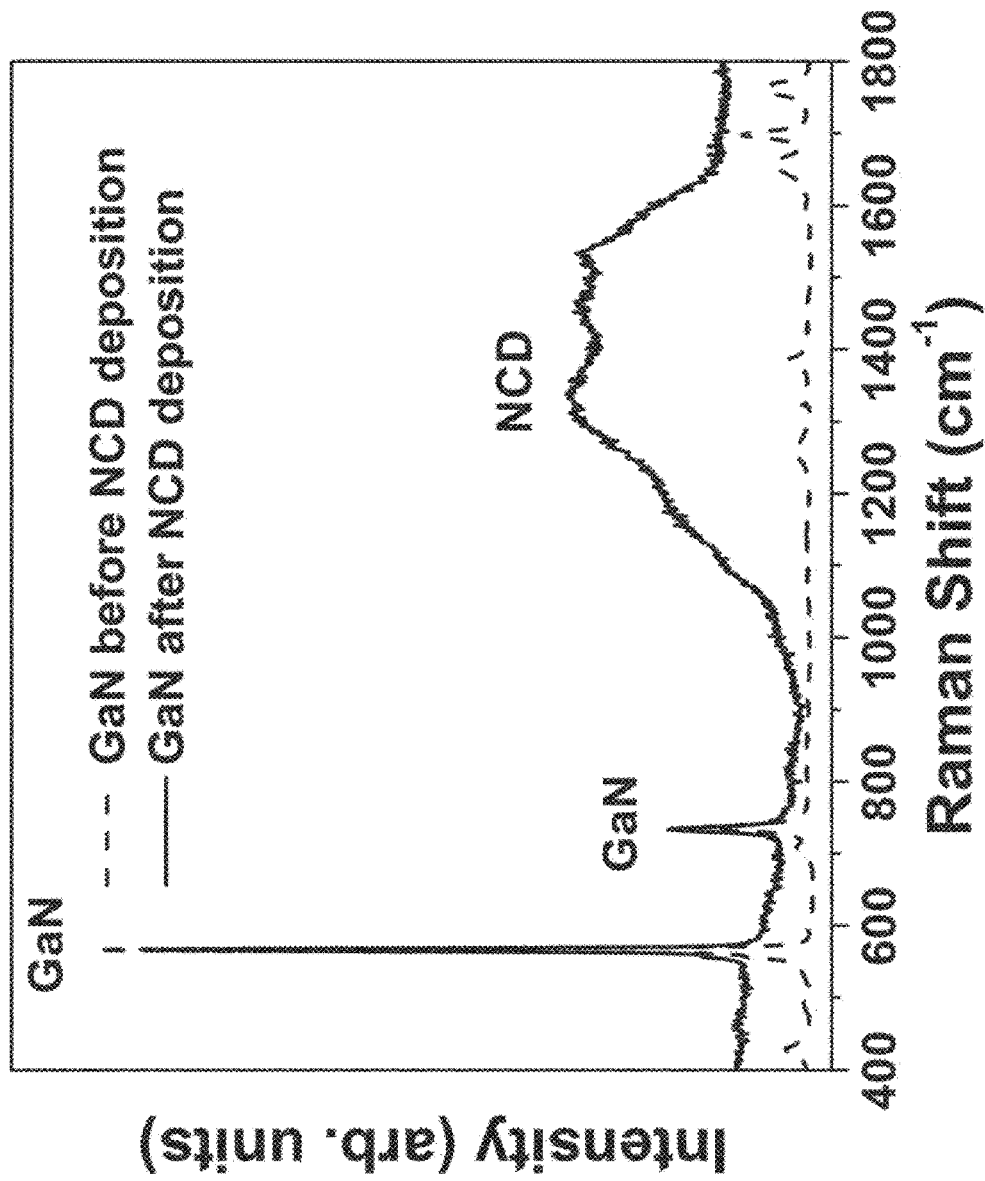
FIG. 12 is a Raman spectra of GaN substrate before and after NCD deposition demonstrating no loss of GaN structure and quality after the diamond deposition.

Raman spectroscopy was performed to assess annealing induced damage that may have occurred in GaN during the NCD deposition. FIG. 12 shows the Raman spectra of a GaN wafer before deposition of NCD layer and after deposition. It is clear that the main GaN peaks at 565 per centimeter and at 737 per centimeter do not change. The spectrum after NCD deposition also shows the characteristic signatures of NCD deposited at lower substrate temperature.

Figure 13:
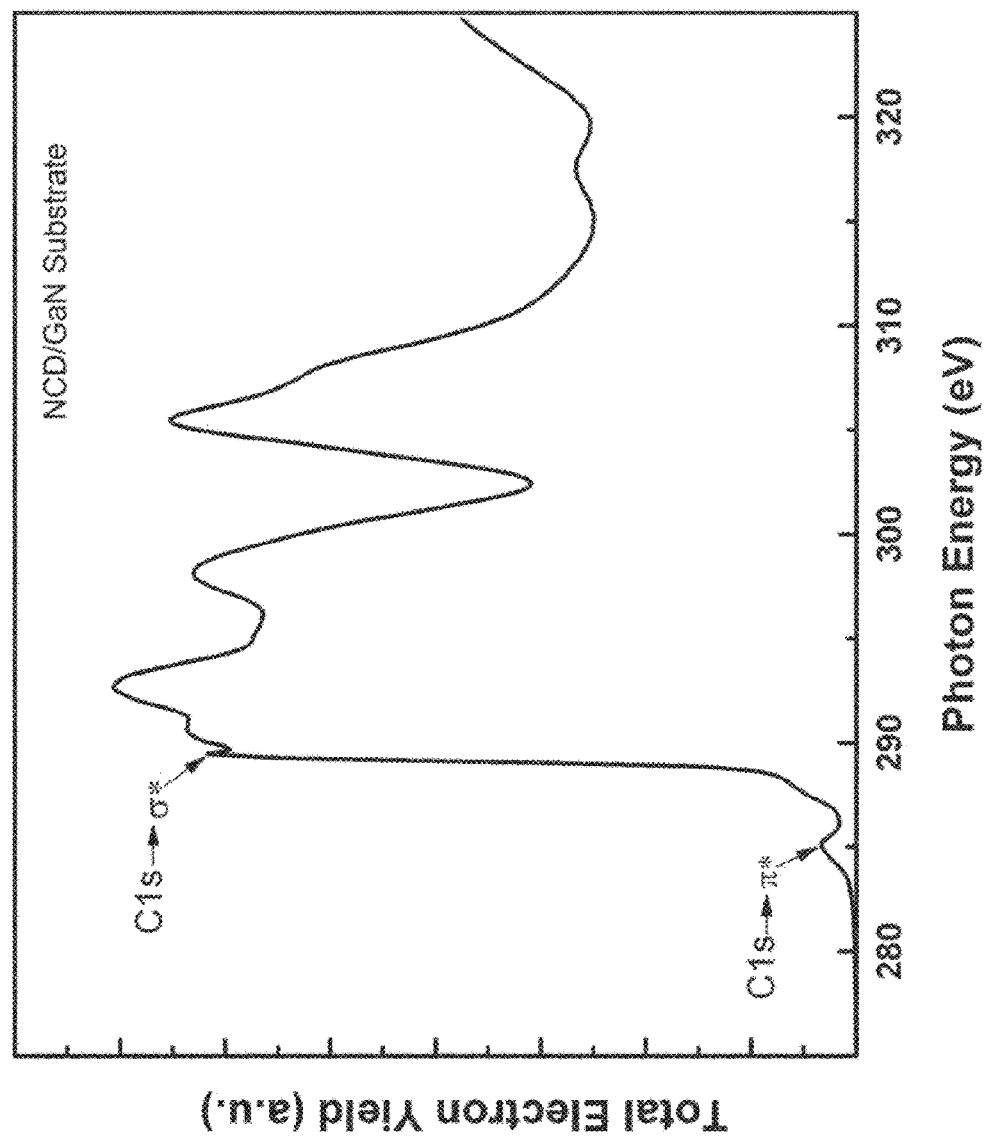
FIG. 13 is a near-edge X-ray absorption fine structure spectroscopy (NEXAFS) spectra taken on NCD film grown on GaN indicating the good quality diamond with the highly $sp^3$ bonding character.

FIG. 13 shows an NEXAFS plot of the NCD film coated GaN substrate. The NEXAFS spectra was taken in the total electron yield (TEY) mode with an incident photon beam normal to the substrate. In FIG. 13, the C1s NEXAFS spectra clearly shows the sharp diamond exciton at 289.3 eV due to the C1s$\sigma$*transition and a pronounced dip at 302 eV due to the second band gap of diamond indicating the high-quality sp$^3$ bonded diamond and a small peak at 285 eV due to the C1s$\rightarrow\pi$*transition indicating a presence of the small fraction of sp$^2$ bonded carbon at the grain boundaries. A small shoulder at 287.5 eV is due to the 1s$\rightarrow\sigma$*resonance of the C—H bond suggesting that the surface is mostly H-terminated. The calculation of sp$^3$ fraction from the NEXAFS spectra yielded a value of about 99% confirming the high quality of the NCD film.

Figure 14:
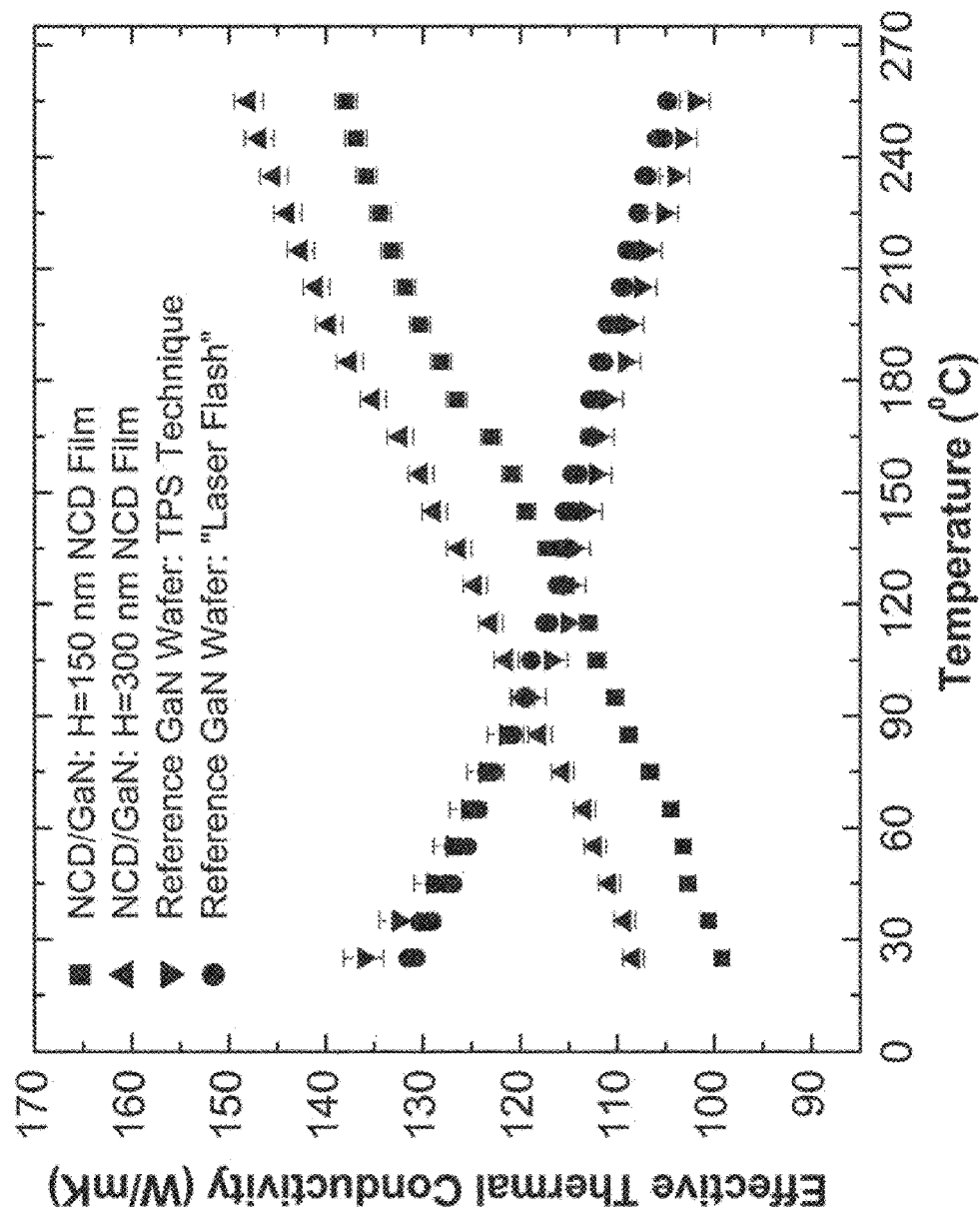
FIG. 14 is a plot of effective thermal conductivity as a function of temperature for two NCD/GaN composite substrates and a reference GaN wafer.

FIG. 14 presents the effective thermal conductivity K$_{eff}$ (T) as a function of temperature, T, for two NCD/GaN samples with NCD films having a thickness of about 150 nm and 300 nm. The term "effective" is used to emphasize that the obtained value of the thermal conductivity is for the composite substrate consisting of GaN substrate and a layer of NCD. The K$_{eff}$ value also includes the effect of the 10-nm thick tungsten layer between NCD and GaN and thermal boundary resistances (TBR) at all interfaces. The effective thermal conductivity value is related to the overall thermal resistance R$_B$ of the NCD/GaN substrate as R$_B$=K$_{eff}$/H$_T$, where H$_T$ is the total thickness of the substrate.

The thermal conductivity of the reference GaN substrate and the NCD/GaN substrates was measured by using transient plane source (TPS) and "laser flash". The K values obtained for the GaN wafer by each technique are in agreement and the thermal conductivity of GaN wafer was found to be K=136 Wm/K at room temperature (RT).

The effective thermal conductivity of the NCD/GaN substrates increases with temperature over the measured temperature range. Furthermore, the effective thermal conductivity of NCD/GaN substrates also increases with increase in thickness of NCD films. The difference in the thermal conductivity temperature dependence for the crystalline GaN and polycrystalline NCD results in the thermal crossover point, where the effective thermal conductivity of NCD/GaN substrate becomes larger than that of the reference GaN substrate. The thermal crossover point is reached at rather low T about 125° C. and further shifts to a lower T about 95° C. as the NCD thickness increases from 150 nm to 300 nm. This demonstrates that although composite NCD/GaN substrates are less thermally conductive than GaN at room temperature, they can become more efficient for heat spreading at the operating temperature of the state-of-the-art GaN based high energy high power semiconductor devices. A higher effective thermal conductivity of the NCD/GaN substrate translates to the lower thermal resistance of the substrate, which is beneficial for heat removal from active GaN semi-conductor devices.

The thermal conductivity of NCD films was approximated using the Debye approximation, $$K=(1/3)C_s \upsilon_g \partial,$$

where $C_s$ is the specific heat capacity, $\upsilon_g$ is the average phonon group velocity, and $\partial$ is the phonon mean free path (MFP) defined as $\partial=\upsilon_g \tau$, where $\tau$ is the phonon relaxation time. The electronic contribution to the thermal conductivity of NCD films can be neglected because of their high electrical resistivity. In NCD, the phonon MFP is limited by the grain size D. Taking reported values of the MFP and K in diamond to be $\Lambda_D$=240 nm and $K_D$=2,000 Wm/K respectively, it can be written:

$$K_{NCD}/K_D = D/\Lambda_D 100 \text{ nm}/240 \text{ nm}=0.42$$

This leads to $K_{NCD}$ about 0.42×2000=833 Wm/K at RT which is substantially higher than the plane GaN substrate.

The thermal conductivity of the NCD was also calculated directly by taking the density and specific heat values to be 3.44 grams per cm$^3$ and 0.511 Joules per grams Kelvin. The group velocity can be assumed to be the same as the velocity of sound in NCD and taken to be 17,980 meters per second. Alternatively, it can be estimated from the equation $\upsilon \upsilon_g = (Y/\rho)$ ½, where Y is the Young's modulus, which is about 1,120 GPa for NCD, and p is the mass density, which gives $\upsilon_g$ to about 18,000 meters per second. Using these values, the lattice thermal conductivity K of NCD with the large grain size (between 100 nm to 200 nm) is calculated to be about 1,110 Wm/K at RT. Both estimates agree, within the uncertainty of the material characteristics, that the thermal conductivity of NCD with the grain size D=100-200 nm is higher than that of GaN.

It is to be noted that FIGS. 10-14 show a bulk GaN substrate which is opaque. In particular embodiments, a thickness of the GaN substrate/thin film can be below a thickness threshold (e.g., less than about 200 nm) such that the GaN substrate has an optical transparency of greater than 80%.

As used herein, the terms "optical transparency," "optical transmittance," and the likes generally describe the percentage of light incident upon a surface that is able to pass through the surface.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

What is claimed is:

1. A method for coating a substrate, comprising:
   producing a plasma ball using a microwave plasma source in the presence of a mixture of gases, the plasma ball having a diameter;
   disposing the plasma ball at a first distance above the substrate such that the plasma ball does not contact the substrate, the substrate maintained at a first temperature of less than 400 degrees Celsius; and
   maintaining the plasma ball at the first distance from the substrate for a first time;
   depositing a diamond coating on the substrate, the diamond coating having a thickness,
   wherein, the diamond coating has an optical transparency of greater than about 80 percent.

2. The method of claim 1, wherein the diamond coating includes nanocrystalline diamond.

3. The method of claim 1, wherein the substrate and/or thin film has a thickness less than a thickness threshold, the thickness enabling the substrate to have an optical transparency of greater than 80%.

4. The method of claim 3, wherein the substrate includes at least one of gallium nitride, aluminum gallium nitride, gallium arsenide, germanium, silicon, silicon nitride and silicon carbide.

5. The method of claim 1, wherein the microwave plasma source has a frequency of about 915 MHz.

6. The method of claim 1, wherein the diameter of the plasma ball is the range of about 15 cms to about 30 cms.

7. The method of claim 1, wherein the first distance is about 0.1 mm to about 5 mm.

8. The method of claim 1, wherein the first time is about 20 minutes to about 60 minutes.

9. The method of claim 1, wherein the thickness of the diamond coating is in the range of about 30 nm to about 150 nm.

\* \* \* \* \*